United States Patent [19]

Shimoto et al.

[11] Patent Number: 5,483,101
[45] Date of Patent: Jan. 9, 1996

[54] MULTILAYER PRINTED CIRCUIT BOARD

[75] Inventors: Tadanori Shimoto; Koji Matsui, both of Tokyo, Japan

[73] Assignee: NEC Corporation, Tokyo, Japan

[21] Appl. No.: 341,202

[22] Filed: Dec. 5, 1994

[30] Foreign Application Priority Data

Dec. 10, 1993 [JP] Japan .................................. 5-310512

[51] Int. Cl.⁶ .................................................. H01L 23/12
[52] U.S. Cl. ........................... 257/701; 257/702; 257/723; 361/750
[58] Field of Search ............................ 428/413; 257/701, 257/702, 723; 361/750, 751, 739

[56] References Cited

U.S. PATENT DOCUMENTS

| | | | |
|---|---|---|---|
| 4,526,835 | 7/1985 | Takahashi et al. | 428/413 |
| 5,137,618 | 8/1992 | Burnett et al. | 205/125 |

FOREIGN PATENT DOCUMENTS

| | | |
|---|---|---|
| 353795 | 8/1991 | Japan . |
| 4167596 | 6/1992 | Japan . |
| 4352387 | 12/1992 | Japan . |

*Primary Examiner*—William Mintel
*Assistant Examiner*—Roy Potter
*Attorney, Agent, or Firm*—Sughrue, Mion, Zinn, Macpeak & Seas

[57] ABSTRACT

A semiconductor package applicable to integrated circuits and other semiconductor devices of the kind needing high integration and high speed operation. The package has a printed circuit board implemented by a glass cloth impregnated with epoxy, bismaleimide-triazine (BT) or similar resin, a power source layer provided in the circuit board in a plate structure, a ground layer formed on the surface of the circuit board in a plate structure, and a thin film laminate wiring formed on the ground layer in a plate structure and consisting of copper and benzocyclobutene. The package desirably shields leakage currents and matches a characteristic impedance with accuracy, thereby noticeably reducing noise and enhancing high speed signal transmission.

8 Claims, 2 Drawing Sheets

MULTILAYER PRINTED CIRCUIT BOARD

BACKGROUND OF THE INVENTION

The present invention relates to a semiconductor package applicable to integrated circuits and other semiconductor devices of the kind needing high integration and high speed operation.

Conventional semiconductor packages include one having an alumina or similar ceramic substrate, a power source and ground layer arranged in the substrate in a mesh structure, a ground layer formed on the surface of the substrate also in a mesh structure, a thin film laminate wiring formed on the surface ground layer by use of polyimide as an intermediate insulation film, and connection terminals provided on the rear of the substrate, as taught in, for example, Japanese Patent Publication No. 3-53795 and Japanese Patent Laid-Open Publication No. 4-352387. This kind of package is susceptible to leakage currents since the ground layers each have a mesh structure. This, coupled with the fact that the accuracy of characteristic impedance matching available with the package is limited, brings about waveform distortion and noise in the event of transmission of high speed signals. Moreover, the ceramic substrate has various problems relating to the process of manufacture and its structure, e.g., that it shrinks during baking, that a binder is not released, and that flatness available with grinding is limited. As a result, a ground layer having a plate structure and capable of fully shielding leakage currents cannot be implemented.

On the other hand, a printed circuit board uses a ground layer having a plate structure. However, with a printed circuit board, a wiring as high in density as the wiring of the ceramic substrate is not achievable unless a great number of through holes are formed in the circuit board. Therefore, the circuit board is no better than a mesh as to structure as well as to shielding ability. Furthermore, since the circuit board is implemented by an impregnated glass cloth, a single insulation layer has a substantial thickness and makes it difficult to reduce the distance between signal lines and the ground layer. As a result, the circuit board suffers from an increase in noise. In addition, the circuit board is basically not feasible for the transmission of high speed signals.

SUMMARY OF THE INVENTION

It is, therefore, an object of the present invention to provide a semiconductor package capable of transmitting high speed signals.

It is another object of the present invention to provide a semiconductor package capable of noticeably reducing noise attributable to leakage currents and mismatching of a characteristic impedance.

In accordance with the present invention, a semiconductor package has a printed circuit board implemented by a glass cloth impregnated with resin resistive to heat, a ground layer formed on the surface of the printed circuit board and provided with a plate structure, and a thin film laminate wiring implemented by a copper thin film conductor formed on the ground layer and benzocyclobutene resin.

Also, in accordance with the present invention, a method of producing a semiconductor package has the steps of preparing a printed circuit board implemented by a glass cloth impregnated with resin resistive to heat, forming a ground layer having a plate structure on the surface of the printed circuit board, and forming a thin film laminate wiring made up of a copper thin film conductor and benzocyclobutene resin on the ground layer.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
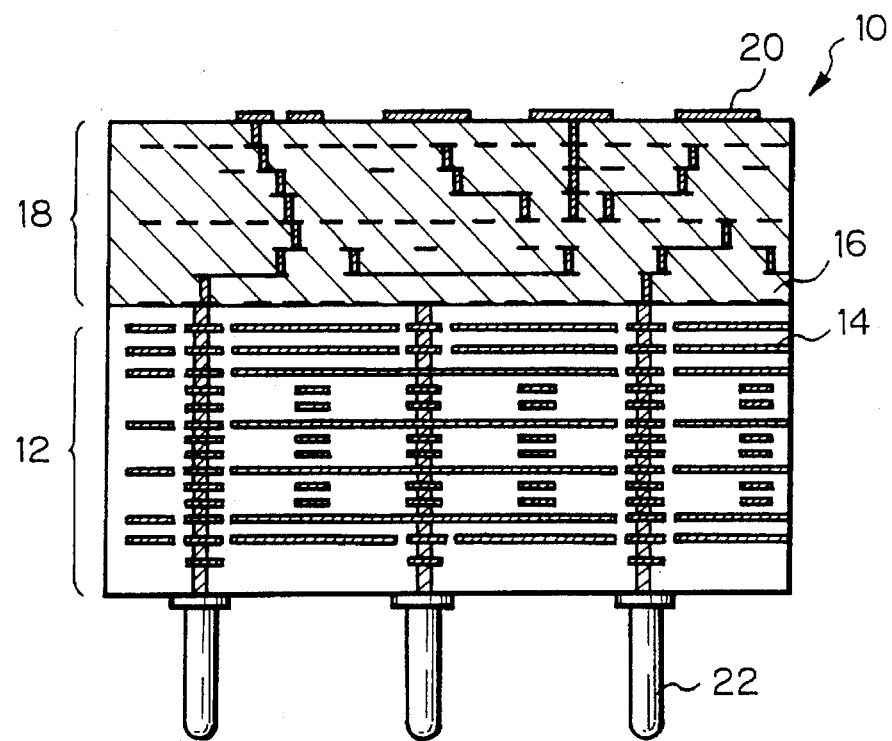
FIG. 1 is a section showing a conventional semiconductor package.

To better understand the present invention, a brief reference will be made to a conventional semiconductor package, shown in FIG. 1. As shown, the package, generally 10, has a ceramic substrate 12 in which power source and ground layers 14 are arranged in a mesh structure. A ground layer 16 is provided on the surface of the substrate 12 also in a mesh structure. A laminate wiring 18 is formed on the ground layer 16 and implemented by thin films of polyimide. Pads 20 are formed on the top of the laminate wiring 18 to connect the package 10 to chips, not shown. Connection terminals 22 are provided on the rear of the substrate 12. This kind of package 10 is susceptible to leakage currents since the ground layers 14 and 16 each has a mesh structure, as stated earlier. This, coupled with the fact that the accuracy of characteristic impedance matching available with the package 10 is limited, brings about waveform distortion and noise in the event of transmission of high speed signals. Moreover, the ceramic substrate 12 has various problems related to the process of manufacture and its structure, e.g., that it shrinks during baking, that a binder is not released, and that flatness available with grinding is limited. As a result, a ground layer having a plate structure and capable of fully shielding leakage currents cannot be implemented.

A preferred embodiment of the semiconductor package in accordance with the present invention will be described hereinafter.

A semiconductor package embodying the present invention has a printed circuit board implemented by a glass cloth which is impregnated with epoxy, bismaleimide-triazine (BT) or similar resin. A power source layer is provided in the circuit board in a plate structure. A ground layer also having a plate structure is provided on the surface of the circuit board. A laminate wiring in the form of thin films of copper and benzocyclobutene is formed on the ground layer constituting a surface layer.

Polyimide customary with semiconductor packages has a hardening temperature higher than 350° C. and is, therefore, problematic in resistivity to heat when used to form a thin film laminate wiring on a printed circuit board. Further, polyimide fails to closely bond to copper contained in a printed circuit board. Various surface treatment schemes have been proposed to eliminate this problem and include the application of a coupling agent and oxygen plasma treatment. However, even with such schemes, it is extremely difficult to achieve a plate structure with polyamide, although they may implement a mesh structure whose surface is not entirely covered with copper.

In contrast, benzocyclobutene has a hardening temperature as low as about 200° C. and is, therefore, sufficiently resistive to heat. It follows that a thin film laminate wiring board using benzocyclobutene for an intermediate insulation film can be readily formed on an epoxy- or BT-based printed circuit board. Further, by applying triethoxyvinylsilane, 3-aminopropyl triethoxysilane or similar silane-based coupling agent, it is possible to set up close bond to various kinds of metallic conductors and, therefore, to form a thin film laminate wiring easily even on a metallic ground layer having a plate structure.

Only the power source layer or the ground layer is provided in the printed circuit board while a signal wiring for transmitting high speed signals is provided in the benzocyclobutene thin film laminate wiring layer. Hence, it is not necessary to form through holes in the ground layer provided on the surface and having a plate structure. This remarkably enhances the shielding ability against leakage currents (noise) and, in addition, promotes accurate characteristic impedance matching. Moreover, benzocyclobutene has a dielectric constant as small as 2.7 and allows signals to be sent at higher speed than conventional semiconductor packages using ceramic or printed circuit boards do, as taught by Japanese Patent Laid-Open Publication No. 4-167596. In addition, benzocyclobutene implements a semiconductor package desirable in resistivity to moisture absorption and reliability.

Figure 2:
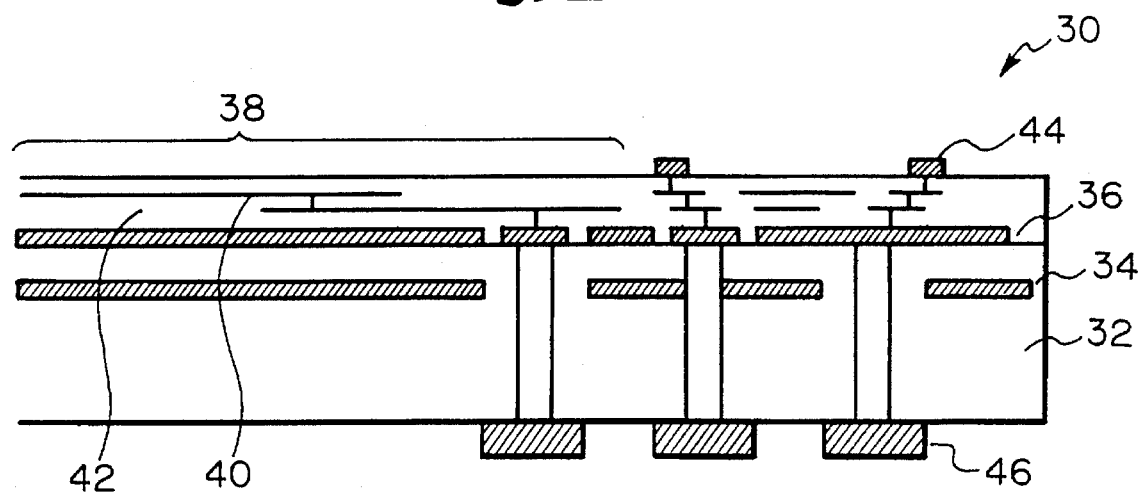
FIG. 2 is a section of a semiconductor package embodying the present invention.

Referring to FIG. 2, a semiconductor package embodying the present invention is shown and generally designated by the reference numeral 30. As shown, the package 30 has a printed circuit board 32 in the form of a glass cloth impregnated with epoxy, BT or similar resin resistive to heat. A copper foil power source layer 34 is disposed in the circuit board 32 and provided with a plate structure. A ground layer 36 is formed on the surface of the circuit board 32 also in a plate structure. The ground layer 36 is formed by, for example, laminating copper foil on the circuit board 32 and then etching it in a desired pattern. Hence, the ground layer 36 has no through holes customary with printed circuit boards. This successfully prevents noise from leaking and sets up a desirable shield.

Figure 3:
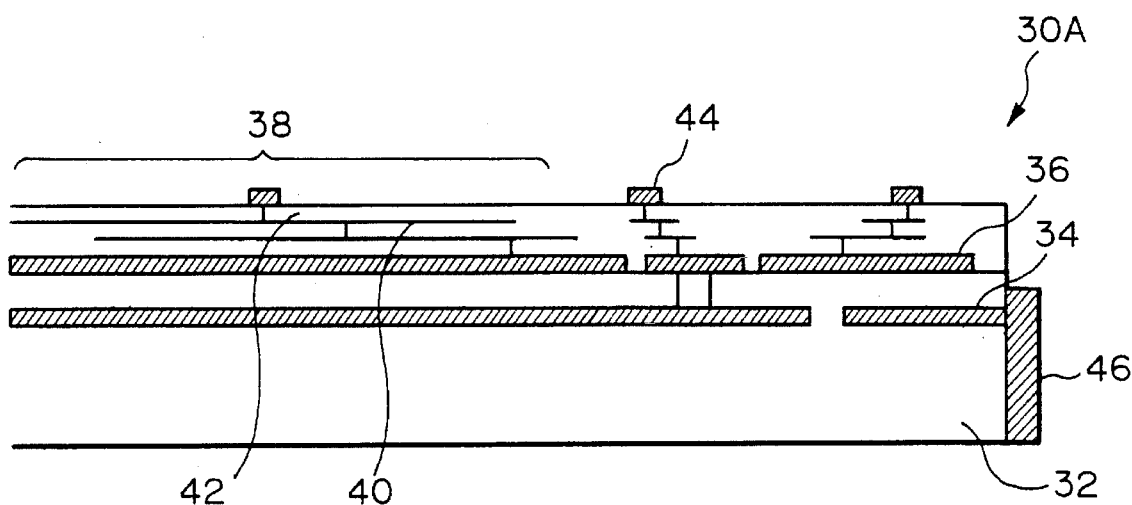
FIGS. 3 and 4 are sections each showing a modified form of the embodiment.
Figure 4:
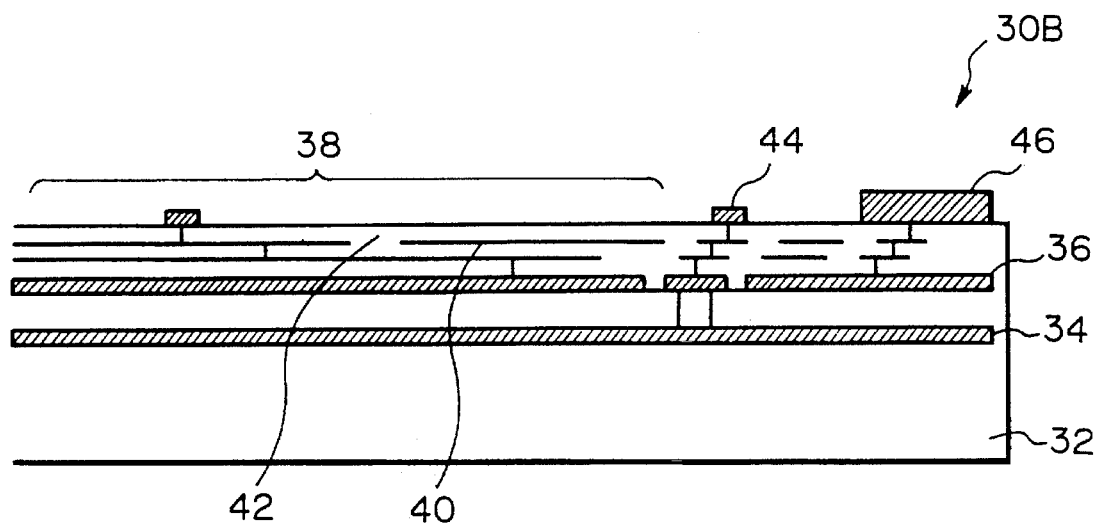

After the ground layer 36 has been formed on the circuit board 32, 2-aminopropyl triethoxysilane is applied to the ground layer 36 as a silane-based coupling agent. Subsequently, a thin film laminate wiring 38 is formed on the ground layer 36 and made up of a copper thin film conductor 40 and benzocyclobutene 42. Finally, pads 44 are provided on the top of the package 30 for connecting the package 30 to chips, not shown. The conductor 40 may be provided not only with the signal wiring but also a ground layer and power source layer, if necessary. Connection terminals 46 are formed on the rear of the circuit board 32, as shown in FIG. 2. FIGS. 3 and 4 respectively show semiconductor packages 30A and 30B which are the modified forms of the package 30. As shown, the connection terminals 46 are provided on the side of the package 30A or on the top of the package 30B outboard of the pads 44. These alternative configurations are practicable due to the inherent formability of the printed circuit board 32.

In summary, it will be seen that the present invention provides a semiconductor package which desirably shields leakage currents and matches a characteristic impedance with accuracy, thereby noticeably reducing noise and enhancing high speed signal transmission. This unprecedented advantage is derived from a unique configuration made up of a printed circuit board implemented by a glass cloth impregnated with epoxy, BT or similar resin, a power source layer provided in the circuit board in a plate structure, a ground layer formed on the surface of the circuit board in a plate structure, and a thin film laminate wiring formed on the ground layer in a plate structure and consisting of copper and benzocyclobutene.

Various modifications will become possible for those skilled in the art after receiving the teachings of the present disclosure without departing from the scope thereof.

What is claimed is:

1. A semiconductor package comprising:

a printed circuit board comprising a glass cloth impregnated with resin resistive to heat;

a ground layer formed on a surface of said printed circuit board and provided with a plate structure, said ground layer etched according to a pattern;

a thin film laminate wiring comprising a copper thin film conductor formed on said ground layer, and benzocyclobutene resin; and a copper foil power source layer disposed in said printed circuit board and provided with a plate structure.

2. A semiconductor package as claimed in claim 1, wherein said resin comprises epoxy.

3. A semiconductor package as claimed in claim 1, wherein said resin comprises bismaleimide-triazine (BT) resin.

4. A semiconductor package as claimed in claim 1, wherein said ground layer is formed by laminating copper foil on said printed circuit board.

5. A semiconductor packages as claimed in claim 1, wherein said copper thin film conductor and said benzocyclobutene resin of said thin film laminate wiring are formed on said ground surface after a silane-based coupling agent has been applied to a surface of said ground layer.

6. A semiconductor package as claimed in claim 5, wherein said silane-based coupling agent comprises 3-aminopropyl triethoxysilane.

7. A semiconductor package as claimed in claim 1, further comprising pads provided on a top of said printed circuit board.

8. A semiconductor package as claimed in claim 7, further comprising connection terminals provided on one of a bottom, a side and the top of said printed circuit board.

* * * * *